United States Patent
Kawamura et al.

(10) Patent No.: US 8,076,239 B2
(45) Date of Patent: Dec. 13, 2011

(54) SEMICONDUCTOR DEVICE AND METHOD OF MANUFACTURING THE SAME

(75) Inventors: Kazuo Kawamura, Kawasaki (JP); Shinichi Akiyama, Kawasaki (JP); Satoshi Takesako, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 299 days.

(21) Appl. No.: 12/031,826

(22) Filed: Feb. 15, 2008

(65) Prior Publication Data
US 2008/0265417 A1 Oct. 30, 2008

(30) Foreign Application Priority Data
Feb. 16, 2007 (JP) ................................ 2007-036377

(51) Int. Cl.
*H01L 21/44* (2006.01)

(52) U.S. Cl. ........ 438/672; 438/675; 438/618; 438/622; 438/625; 438/642; 438/643; 438/648; 438/649; 257/E21.585; 257/E21.586; 257/E21.593; 257/E21.622; 257/E21.627; 257/E21.634; 257/E21.156

(58) Field of Classification Search .............. 438/672, 438/675
See application file for complete search history.

(56) References Cited

U.S. PATENT DOCUMENTS

| | | | |
|---|---|---|---|
| 5,747,384 A | 5/1998 | Miyamoto | |
| 5,831,335 A * | 11/1998 | Miyamoto | 257/757 |
| 5,888,895 A * | 3/1999 | Mizobuchi | 438/621 |
| 6,146,991 A * | 11/2000 | Cheng et al. | 438/622 |
| 6,171,943 B1 * | 1/2001 | Doan et al. | 438/618 |
| 6,174,805 B1 * | 1/2001 | Urabe | 438/648 |
| 6,184,138 B1 * | 2/2001 | Ho et al. | 438/687 |
| 6,204,170 B1 * | 3/2001 | Taguwa | 438/649 |
| 6,277,744 B1 * | 8/2001 | Yuan et al. | 438/685 |
| 6,294,466 B1 * | 9/2001 | Chang | 438/680 |
| 6,531,192 B2 * | 3/2003 | Akram | 427/575 |
| 6,566,718 B2 * | 5/2003 | Wieczorek et al. | 257/368 |
| 6,635,569 B1 * | 10/2003 | Ameen et al. | 438/680 |
| 7,407,875 B2 * | 8/2008 | Wong et al. | 438/548 |
| 7,484,513 B2 * | 2/2009 | Tada et al. | 134/1.1 |
| 2001/0009154 A1 * | 7/2001 | Nguyen et al. | 134/1 |

(Continued)

FOREIGN PATENT DOCUMENTS

EP 1139391 A1 10/2001

(Continued)

OTHER PUBLICATIONS

S. Demuynck et al. 2008 IEEE International Interconnect Technology Conference; "Impact of Cu contacts on frontend performance: a projection towards 22nm node," 2006 IEEE; pp. 178-180.
Korean Office Action dated Nov. 20, 2009, issued in corresponding Korean Patent Application No. 1020080013816.

*Primary Examiner* — Charles Garber
*Assistant Examiner* — Pape Sene
(74) *Attorney, Agent, or Firm* — Fujitsu Patent Center

(57) ABSTRACT

A method of manufacturing a semiconductor device, includes the steps of forming an insulating film on a semiconductor substrate having a silicide layer, forming a hole in the insulating film on the silicide layer, cleaning an inside of the hole and a surface of the silicide layer, forming a titanium layer on a bottom surface and an inner peripheral surface of the hole by a CVD method, forming a copper diffusion preventing barrier metal layer on the titanium layer in the hole, and burying a copper layer in the hole.

15 Claims, 16 Drawing Sheets

U.S. PATENT DOCUMENTS

| | | | |
|---|---|---|---|
| 2002/0020476 A1* | 2/2002 | Ishii et al. | 148/669 |
| 2002/0043772 A1* | 4/2002 | Huchet et al. | 277/634 |
| 2004/0113209 A1* | 6/2004 | Izuha et al. | 257/388 |
| 2005/0221612 A1* | 10/2005 | Brown et al. | 438/643 |
| 2006/0125022 A1* | 6/2006 | Kawamura | 257/384 |
| 2006/0128108 A1* | 6/2006 | Kim et al. | 438/381 |
| 2006/0211202 A1* | 9/2006 | Byun et al. | 438/258 |
| 2007/0155157 A1* | 7/2007 | Chou et al. | 438/618 |
| 2007/0170588 A1* | 7/2007 | Goto | 257/754 |

FOREIGN PATENT DOCUMENTS

| | | |
|---|---|---|
| JP | 8-176823 A | 7/1996 |
| JP | 8-213343 A | 8/1996 |
| JP | 2001-326227 A | 11/2001 |
| KR | 1020010082707 A | 8/2001 |
| KR | 1020050070319 A | 7/2005 |

* cited by examiner

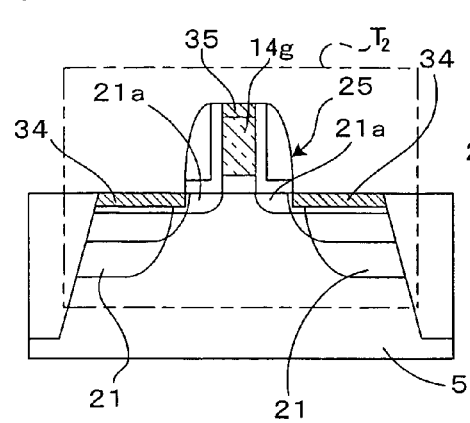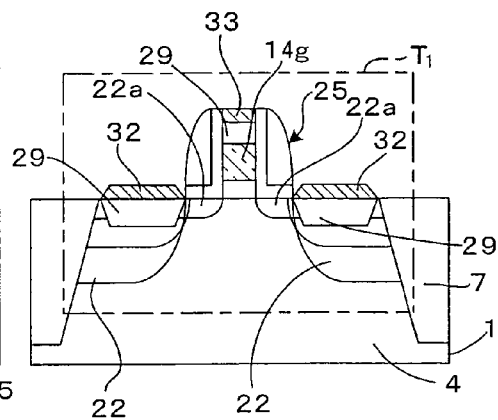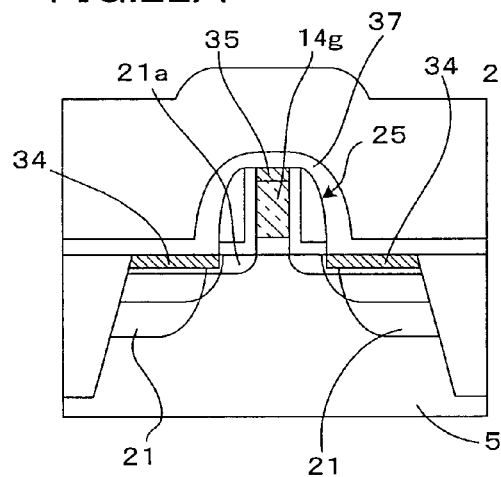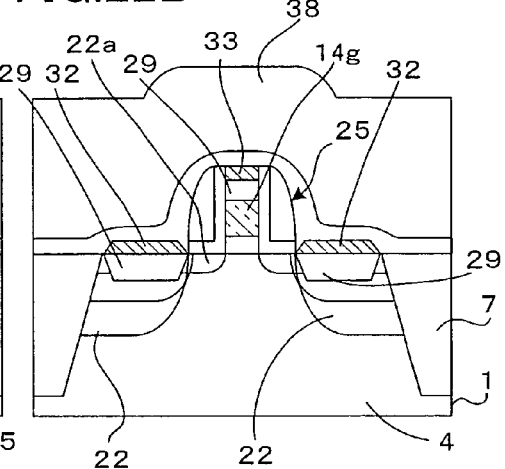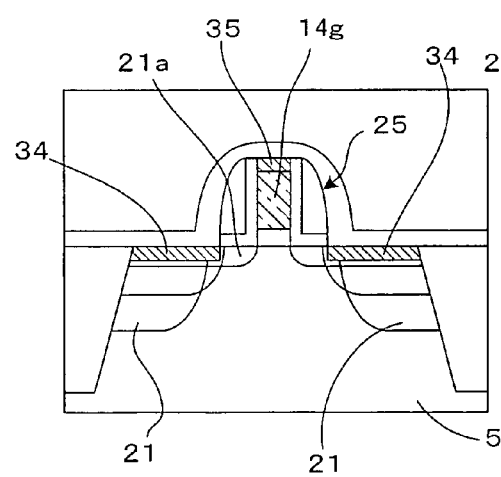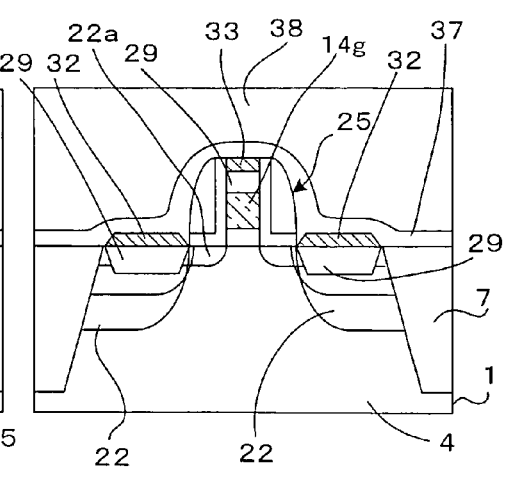

US 8,076,239 B2

SEMICONDUCTOR DEVICE AND METHOD OF MANUFACTURING THE SAME

CROSS-RELATED APPLICATION

This application claims priority to Japanese Patent Application 2007-036377, filed Feb. 16, 2007, and is fully incorporated herein by reference.

FIELD OF THE INVENTION

The present invention relates to a semiconductor device and a method of manufacturing the same and, more particularly, a semiconductor device having the copper plugs and a method of manufacturing the same.

BACKGROUND OF THE INVENTION

In the prior art, the process of burying the plug made of tungsten in the contact hole, which is formed in an insulating film on the silicon substrate, contains the steps of forming a contact hole in the insulating film, cleaning the inside of the contact hole by the negative sputtering, forming a titanium film on an upper surface of the insulating film and an inner surface of the contact hole by the physical vapor deposition (PVD), growing a titanium nitride film on the Ti film by the metal organic chemical vapor deposition (MOCVD), burying a tungsten in the contact hole, and then removing the tungsten, the TiN film, and the Ti film on the insulating film by the chemical mechanical polishing (CMP). The tungsten buried in the contact hole serves as the plug.

Japanese Laid-open Patent Publication No. Hei-8-176823 discloses the process of forming the Ti film before growing the tungsten or the aluminum in the contact hole of 0.2 μm diameter, wherein the process consists of the steps of supplying a reaction gas, which contains titanium tetrachloride and hydrogen rich, to the growth atmosphere and thereby removing a native oxide on a silicon substrate and then forming the Ti film by reducing a flow rate of $H_2$.

Japanese Laid-open Patent Publication No. Hei-8-213343 discloses the process of forming the Ti film before growing the tungsten or the aluminum in the contact hole of 0.2 μm diameter, wherein the process consists of the step of reducing an amount of chlorine in the Ti film by flowing $TiCl_4$ in a $H_2$ rich condition.

Also, Japanese Laid-open Patent Publication No. 2001-326227 discloses the process comprising the steps of forming a hole in an insulating film on some layer, forming a barrier layer on an inner surface of the hole and an upper surface of the insulating film, vapor-phase depositing a copper seed layer on the barrier layer, and forming a copper bulk layer on the copper seed layer by the plating to bury the hole. A specific resistance of copper is 1.7 μΩ·cm, and is lower than a specific resistance 5.0 μΩ·cm of tungsten. Thus, the copper is expected as the good material to lower the contact resistance.

The copper is also used the plug that connect the impurity diffusion region in the silicon substrate and the wiring formed over the region. The copper plug that is shaped into the contact of 160 nm diameter is set forth in S. Demuynck, et al. Impact of Cu contacts on front-end performance: a projection towards 22 nm node, International Interconnect Technology Conference 2006, p. 178.

SUMMARY OF THE INVENTION

According to one aspect of an embodiment, a method of manufacturing a semiconductor device includes forming a silicide layer over a semiconductor substrate, forming a titanium layer over the silicide layer, forming a copper diffusion preventing barrier layer over the titanium layer, and forming a copper layer over the barrier layer.

BRIEF DESCRIPTION OF THE DRAWINGS

Understanding of the present invention will be facilitated by consideration of the following detailed description of the preferred embodiments of the present invention taken in conjunction with the accompanying drawings, in which like numerals refer to like parts and in which:

FIGS. 2A to 28A, 28B, 29 and 30 are sectional views showing steps of forming the semiconductor device according to the embodiment of the present invention;

DESCRIPTION OF THE PREFERRED EMBODIMENTS

The present invention will be described in detail in connection with non-limiting embodiments with reference to the accompanying drawings.

Figure 32A:
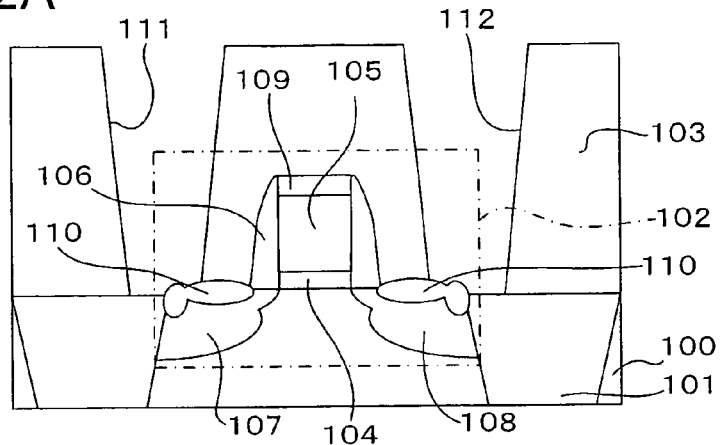
FIGS. 32A to 32C are sectional views showing steps of forming a semiconductor device for reference.
Figure 32B:
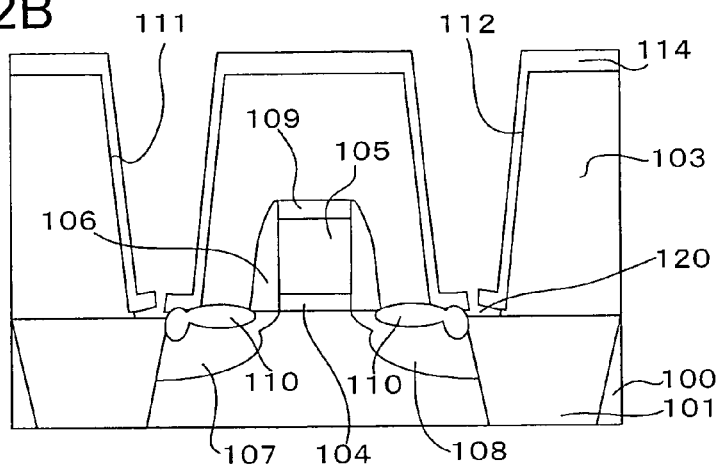
Figure 32C:
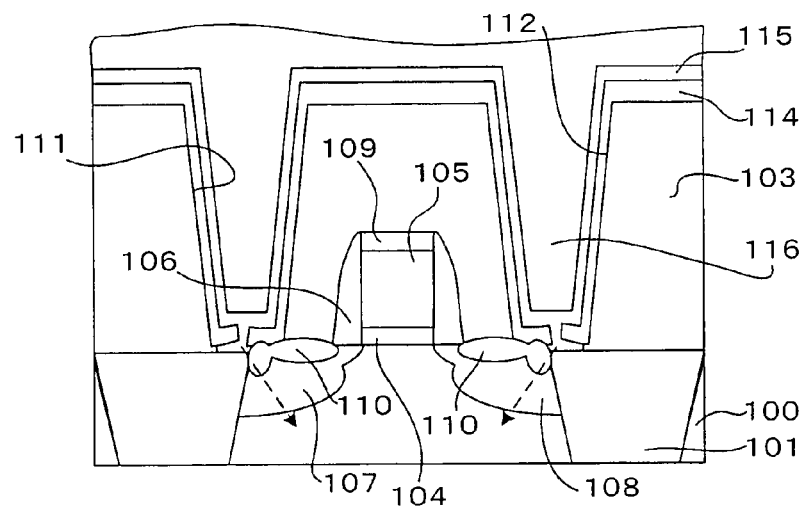

The copper plugs are formed by the process shown in FIG. 32A to FIG. 32C, for example.

First, in FIG. 32A, a MOS transistor 102 is formed in a region that is formed in a silicon substrate 100 and surrounded by an element isolation insulating film 101. Also, the MOS transistor 102 and the silicon substrate 100 are covered with an interlayer insulating film 103.

The MOS transistor 102 is constructed by a gate electrode 105 formed on the silicon substrate 100 via a gate insulating film 104, an insulating sidewall 106 formed on side walls of the gate electrode 105 respectively, source/drain regions 107, 108 formed on the silicon substrate 100 on both sides of the gate electrode 105, and the like. In this case, the gate electrode 105 is formed of silicon, for example. Also, silicides 109, 110 are formed on surfaces of the gate electrode 105 and the source/drain regions 107, 108 respectively.

In such state, first, contact holes 111, 112 are formed in the interlayer insulating film 103 on the source/drain regions 107, 108. Then, as shown in FIG. 32B, a Ta barrier layer 114, for example, is formed inner surfaces of the contact holes 111, 112 and an upper surface of the interlayer insulating film 103 by the PVD method such as the sputtering, or the like.

Then, as shown in FIG. 32C, a copper (Cu) seed layer 115 is formed on the Ta barrier layer 114 by the sputtering. Then, a Cu layer 116 is buried in the contact holes 111, 112 by the plating, and then the Cu layer 116, the Cu seed layer 115, and the Ta barrier layer 114 formed on the interlayer insulating film 103 are removed by the chemical mechanical polishing. Thus, the copper film left in the contact holes 111, 112 is used as the plug (not shown).

Meanwhile, when a diameter of the contact holes 111, 112 is less than 80 nm and an aspect ratio is more than 3 to form the deep hole, it is difficult to bury the Ta barrier layer 114 in the contact holes 111, 112. As described later, a level difference is ready to occur on bottom portions of the contact holes 111, 112 that reach the silicon substrate 100 containing the shallow trench isolation (abbreviated as "STI" hereinafter). Thus, when the Ta barrier layer 114 is formed, a void 120 is generated on the bottom portions of the contact holes 111, 112 or the silicon substrate 100 or the silicides 109, 110 is easily exposed from a part of the bottom portions.

As a result, as shown in FIG. 32C, the Cu seed layer 115 is ready to break through the Ta barrier layer 114 and contact the silicon substrate 100 or the silicides 109, 110 in the contact holes 111, 112. It is feared that Cu is diffused into the silicon substrate 100 in the heating process applied thereafter and a junction leakage is increased.

Also, when the void 120 exists between the Cu layer 116 and the silicide 110 in the contact holes 111, 112, a contact failure is caused between them. Thus, the contact resistance between the Cu layer 116 and the source/drain regions 107, 108 is hard to decrease. Also, even though the Ta barrier layer 114 covers the overall suicides 109, 110 in the contact holes 111, 112, an oxide film is present at the interface between the Ta barrier layer 114 and the silicides 109, 110 and acts as an obstacle in reducing their contact resistance. Thus, the oxide film must be removed from the surface of the silicide without damage of the silicide. In addition, various problems exist such that a temperature applied in the Cu plug forming process is limited due to thermal stability of the silicide, and the like.

It is an object of the present invention to provide a semiconductor device capable of realizing a good contact between a copper plug formed in a hole and a silicide layer under the hole, and a method of manufacturing the same.

According to an aspect of an embodiment of the present invention, a method of manufacturing a semiconductor device, includes the steps of forming a hole on a silicide layer on a semiconductor substrate covered with an insulating film, forming a titanium layer on an inner wall surface of the hole, forming a copper diffusion preventing barrier layer on the titanium layer in the hole, and forming a copper layer on the barrier layer to bury the hole. The titanium layer is formed by chemical vapor deposition (CVD) method, for example.

According to the embodiment, the titanium layer of good coverage is formed as a glue layer on the inner surface of the hole in the insulating film by CVD method, for example, and then the barrier layer is formed on the titanium layer. The titanium layer when formed by the CVD method has no unevenness or reduced unevenness surface state on the bottom portion of the hole. Therefore, the barrier layer can be formed with good coverage not to generate the void and can cover satisfactorily the bottom portion of the hole. As a result, a diffusion of copper buried in the hole into the silicide layer or a defective connection to the silicide layer can be prevented.

In addition, since a gas having a reducing power is used as a reaction gas to form the titanium layer, the surface of the silicide layer is cleaned. Therefore, the silicide layer is connected satisfactorily to the titanium layer and the barrier layer, and also an increase of the contact resistance can be suppressed.

An embodiment of the present invention will be explained in detail with reference to the drawings hereinafter.

FIG. 1A to FIG. 1K are sectional views showing steps of forming a semiconductor device according to an embodiment of the present invention. In the preferred embodiment, a detailed explanation of the improved method will be provided with respect to the example of the manufacturing the semiconductor device. Of course, the invention is not limited to a semiconductor device.

First, steps of forming an element isolation layer and wells on a silicon substrate as a semiconductor substrate will be explained below.

Figure 1A:
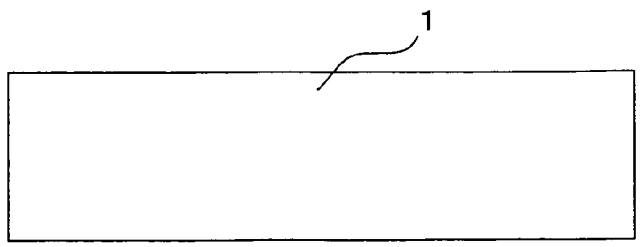
FIGS. 1A to 1K are sectional views showing steps of forming a semiconductor device according to an embodiment of the present invention.
Figure 1B:
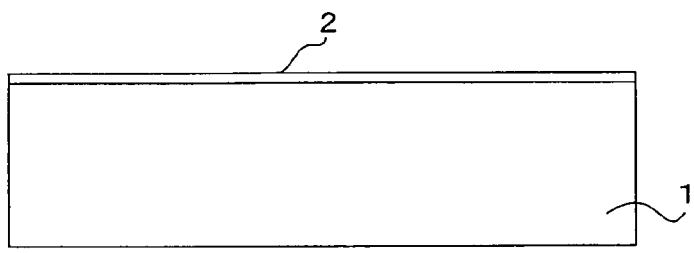

As shown in FIG. 1A, a (100) plane as a principal plane of a p-type silicon substrate 1, for example, is rinsed by using ammonia and hydrogen peroxide. Then, as shown in FIG. 1B, a silicon oxide film 2 of 50 nm thickness, for example, is formed by thermally oxidizing the principal plane of the silicon substrate 1.

Figure 1C:
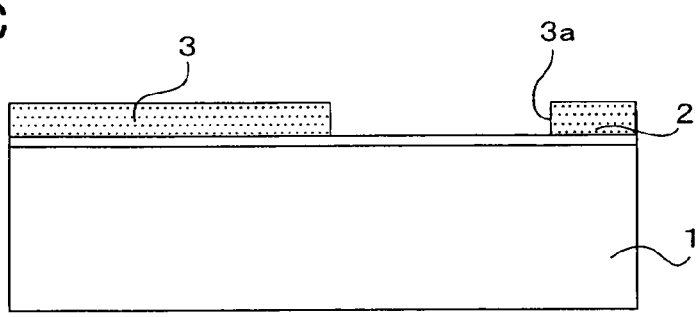

Then, as shown in FIG. 1C, a photoresist 3 is coated on the silicon oxide film 2, and then an opening 3a is formed in the well forming region by exposing/developing this photoresist. Then, the silicon oxide film 2 is etched through the opening 3a in the photoresist 3 by the hydrofluoric acid, for example, and thus an opening 2a is formed.

Figure 1D:
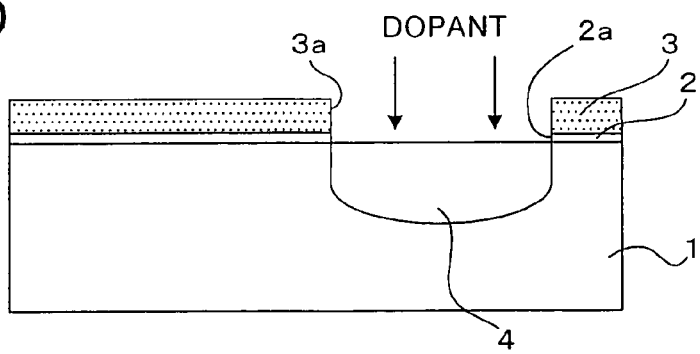

Then, as shown in FIG. 1D, a first well is formed by ion-implanting a dopant into the silicon substrate 1 through the openings 3a, 2a. The first well is formed as either of the N-well and the P-well, but an N-well 4 is formed as the first well herein. In order to form the N-well 4, for example, phosphorus ion as the n-type dopant is introduced into the silicon substrate 1 under conditions that an acceleration energy is 300 keV and a dosage is $1 \times 10^{13}/cm^2$.

Figure 1E:
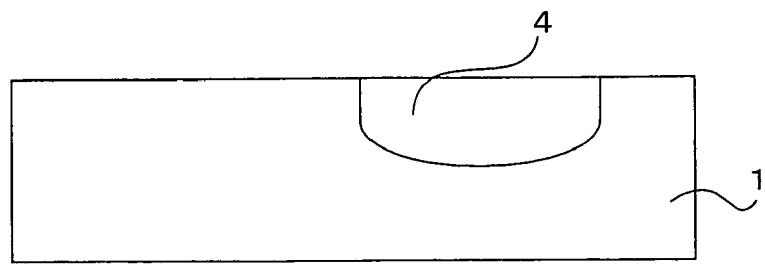

Then, as shown in FIG. 1E, the photoresist 3 is removed. Then, the silicon oxide film 2 is removed by the hydrofluoric acid, for example.

Figure 1F:
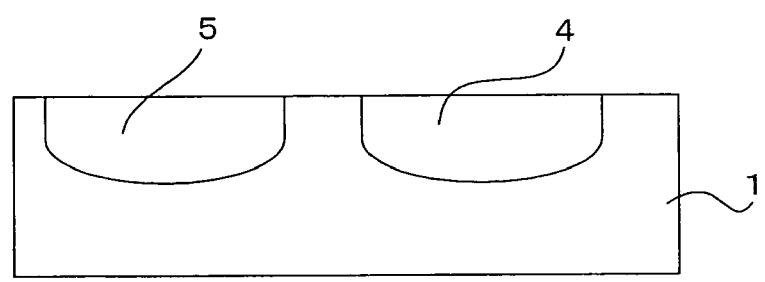

Then, as shown in FIG. 1F, a P-well 5 is formed as a second well on the silicon substrate 1. Like the formation of the first well 4, the method of forming the P-well 5 contains the steps of forming the silicon oxide film, the photoresist, and the opening on the silicon substrate 1 respectively, and then introducing a p-type dopant into a predetermined region of the silicon substrate 1 through the opening. For example, boron ion as the p-type dopant is introduced into the silicon substrate 1 under conditions that an acceleration energy is 120 keV and a dosage is $1 \times 10^{13}/cm^2$.

Figure 1G:
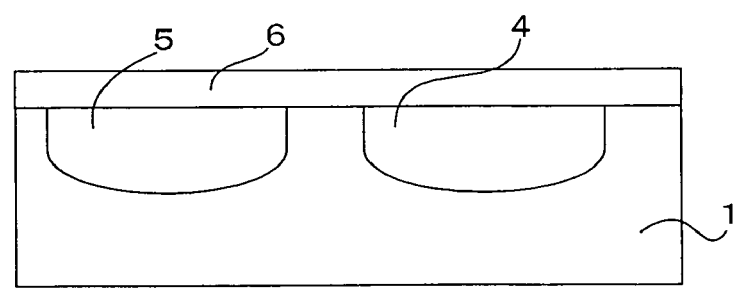
Figure 1H:
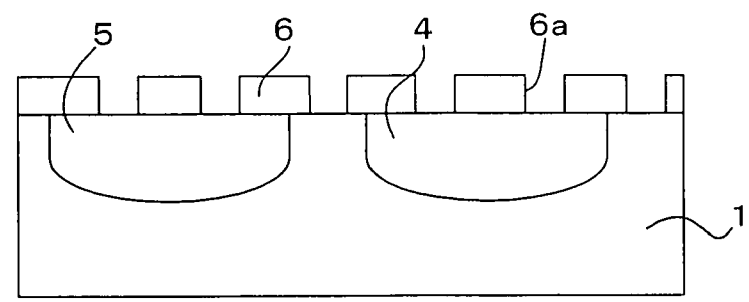
Figure 1:
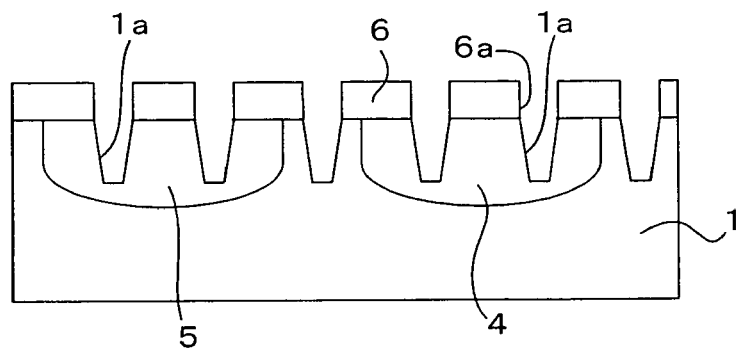

Then, as shown in FIG. 1G, a silicon nitride film 6 of 50 nm thickness is formed on the principal plane of the silicon substrate 1 by CVD method. Then, as shown in FIG. 1H, the silicon nitride film 6 is patterned by the photolithography using a photoresist, and thus openings 6a are formed in the element isolation region.

Figure 1J:
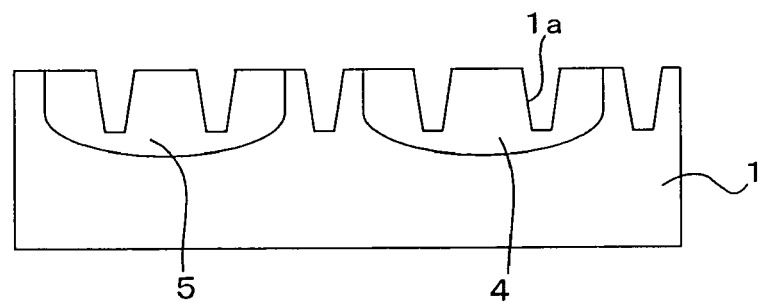
Figure 1K:
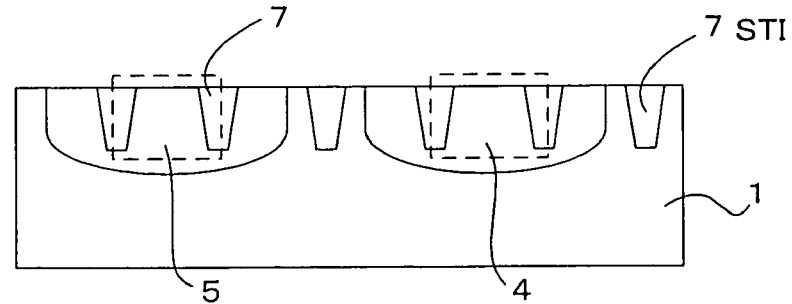

Then, as shown in FIG. 1I, the silicon substrate 1 is etched through the openings 6a in the silicon nitride film 6 by the reactive ion etching (RIE) method, for example, and thus STI burying recesses 1a are formed. Then, as shown in FIG. 1J, the silicon nitride film 6 is removed by the phosphoric acid. Then, a silicon oxide film is formed by the CVD method to bury the STI burying recesses 1a. Then, as shown in FIG. 1K, the silicon oxide film grown on the principal plane of the silicon substrate 1 is removed by the CMP. Then, the silicon oxide film left in the STI burying recesses 1a is used as STI 7.

Then, the process of forming a MOS transistor in respective regions of the P-well 5 and the N-well 4 encircled by a broken line in FIG. 1K and the process of forming a plug and a wiring connected to the MOS transistor will be explained hereunder.

Figure 2A:
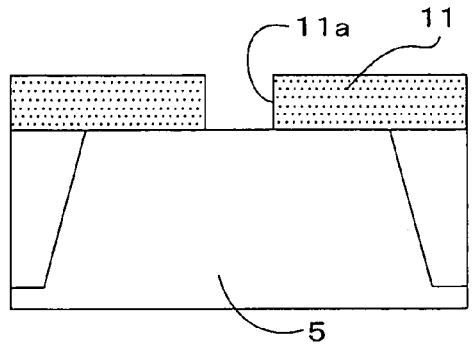
Figure 2B:
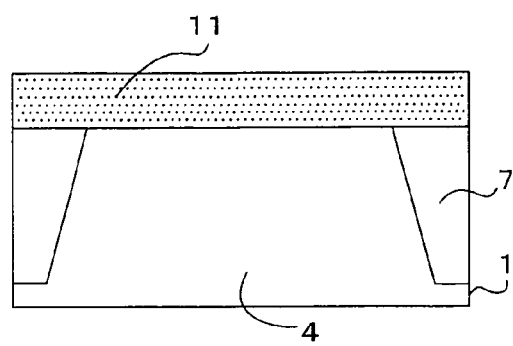

FIGS. 2A and 2B show parts of the P-well 5 and the N-well 4 on the silicon substrate 1 indicated as the broken-line encircled portions in FIG. 1K in an enlarged fashion. A photoresist 11 is coated on the principal plane of the silicon substrate 1. An opening 11a is formed in the photoresist 11 on a channel region of the P-well 5 surrounded by the STI 7 by exposing/developing this photoresist.

Figure 3A:
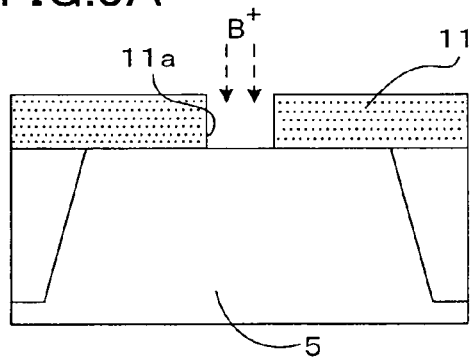
Figure 3B:
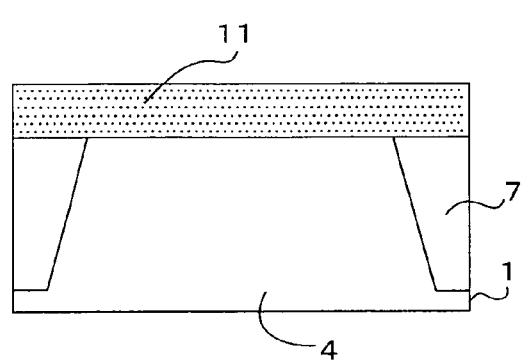

Then, as shown in FIGS. 3A and 3B, boron ion is ion-implanted into the P-well 5 through the opening 11a in the photoresist 11. As the boron ion implantation conditions, for example, an acceleration energy of 15 keV and a dosage of $1\times10^{13}/cm^2$ are selected.

Figure 4A:
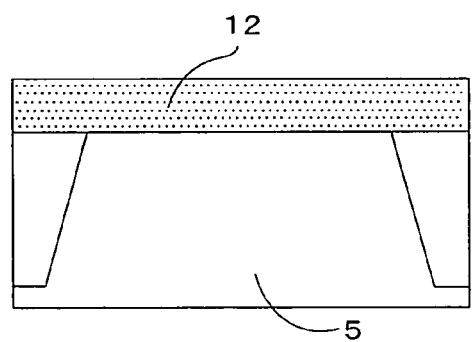
Figure 4B:
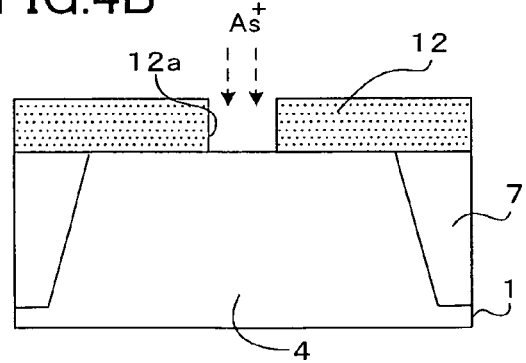

Then, as shown in FIGS. 4A and 4B, the photoresist 11 is removed, and then another photoresist 12 is coated on the silicon substrate 1. Then, an opening 12a is formed on a channel region of the N-well 4 by exposing/developing this photoresist. An arsenic ion is implanted into the N-well 4 through the opening 12a. As the arsenic ion implantation conditions, for example, an acceleration energy of 80 keV and a dosage of $1\times10^{13}/cm^2$ are selected.

Figure 5A:
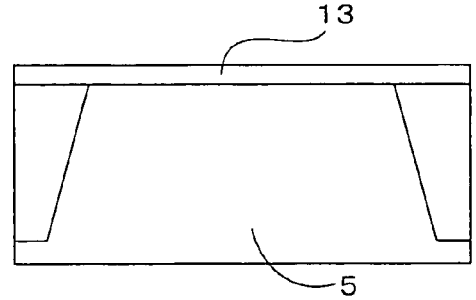
Figure 5B:
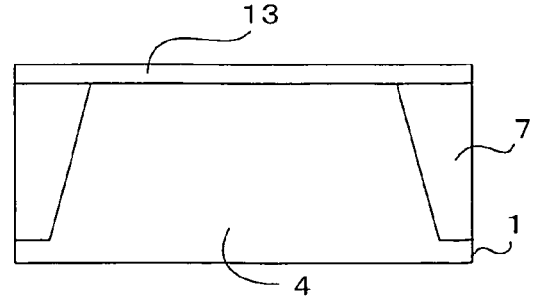

Then, the photoresist 12 is removed. Then, in order to activate boron ion and arsenic ion introduced into the P-well 5 and the N-well 4 respectively, the silicon substrate 1 is annealed at 950° C. for 10 second. Then, as shown in FIGS. 5A and 5B, a silicon oxide film of 2 nm thickness, for example, is formed as a gate insulating film 13 by the CVD method.

Figure 6A:
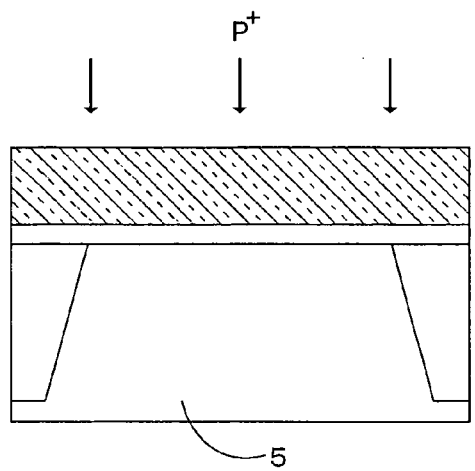
Figure 6A:
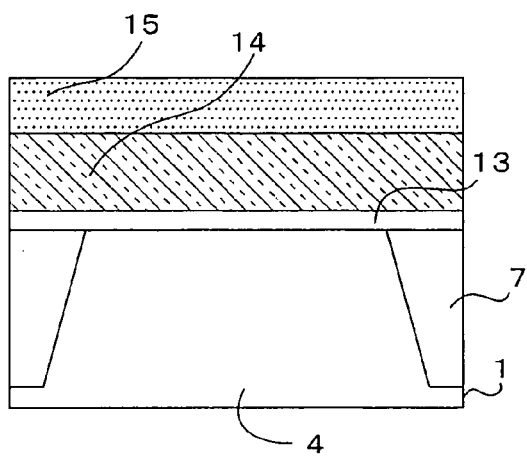

Then, as shown in FIGS. 6A and 6B, a polysilicon film 14 of 100 nm thickness, for example, is grown on the gate insulating film 13 by the CVD method. Then, a photoresist 15 is coated on the polysilicon film 14, and then a region of the polysilicon film 14 over the P-well 5 is opened by exposing/developing this photoresist.

Subsequently, the phosphorus is ion-implanted into the polysilicon film 14 on the P-well 5 exposed from the photoresist 15 under conditions that an acceleration energy is 10 keV and a dosage is $1\times10^{16}/cm^2$. Thus, a conduction type of the polysilicon film 14 in this region is set partially to the n type.

Figure 7A:
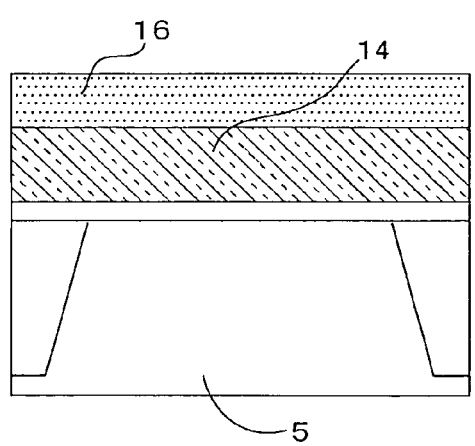
Figure 7B:
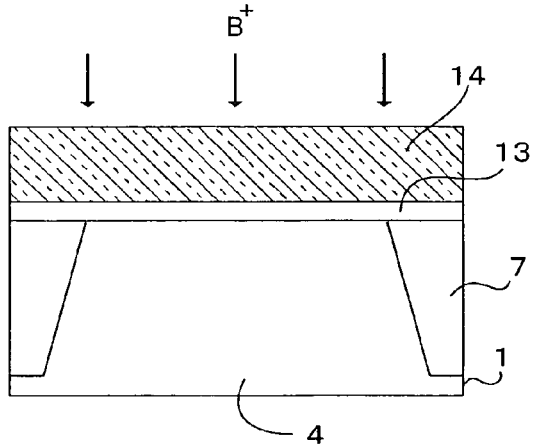

Then, the photoresist 15 is removed, and then another photoresist 16 is coated on the polysilicon film 14. The region of the photoresist 16 on the N-well 4 is opened by exposing/developing this photoresist. Then, as shown in FIGS. 7A and 7B, the boron is ion-implanted into the polysilicon film 14 on the N-well 4 exposed from the photoresist 16 under conditions that an acceleration energy is 5 keV and a dosage is $5\times10^{15}/cm^2$. Thus, a conduction type of the polysilicon film 14 in this region is set partially to the p type.

Figure 8A:
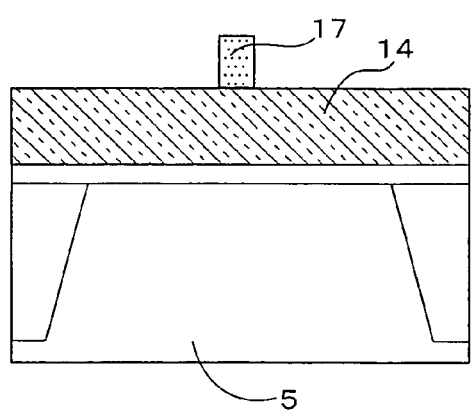
Figure 8B:
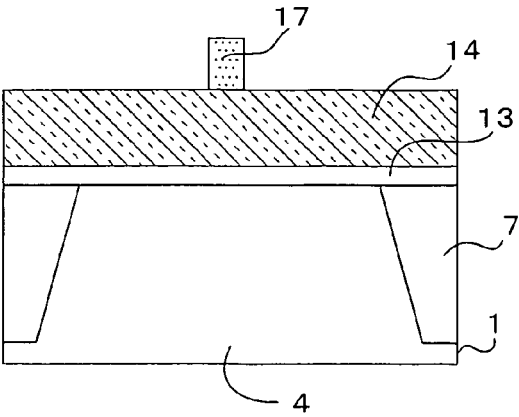

Then, the photoresist 16 is removed. Then, as shown in FIGS. 8A and 8B, still another photoresist is coated on the polysilicon film 14. Then, resist patterns 17 for covering gate regions of the N-well 4 and the P-well 5 respectively are formed by exposing/developing this photoresist.

Figure 9A:
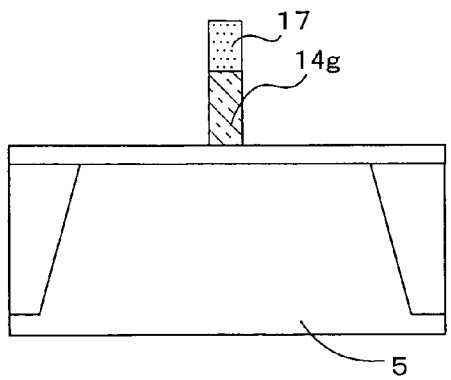
Figure 9B:
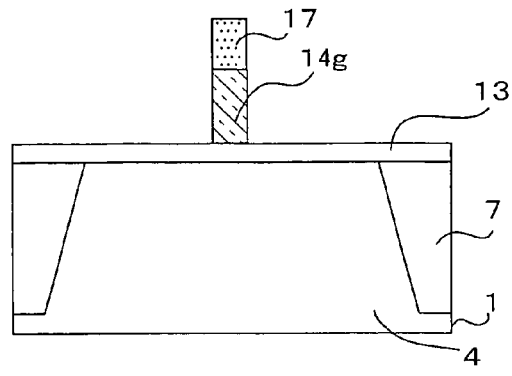

Then, as shown in FIGS. 9A and 9B, the polysilicon film 14 in the region that is not covered with the resist patterns 17 is removed by the etching. Thus, the polysilicon film 14 being left under the resist patterns 17 are used as gate electrodes 14g. In this case, a high-dielectric material may be used as the gate insulating film, and a metal gate made of a metal may be used as the gate electrode.

Figure 10A:
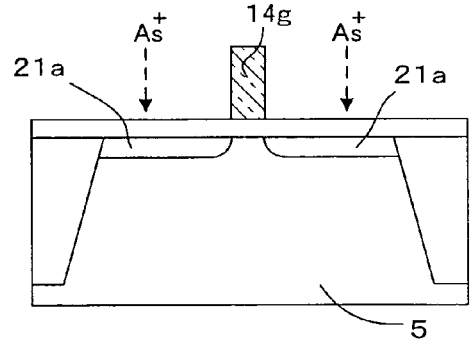
Figure 10A:
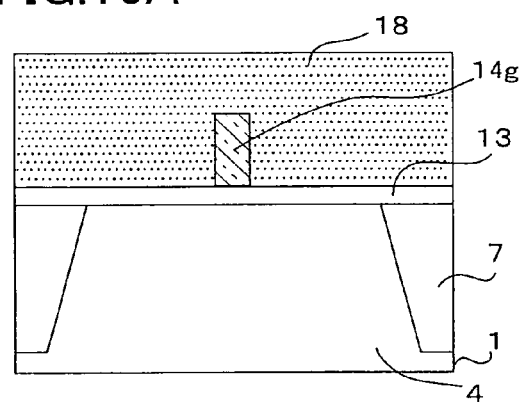
Figure 11A:
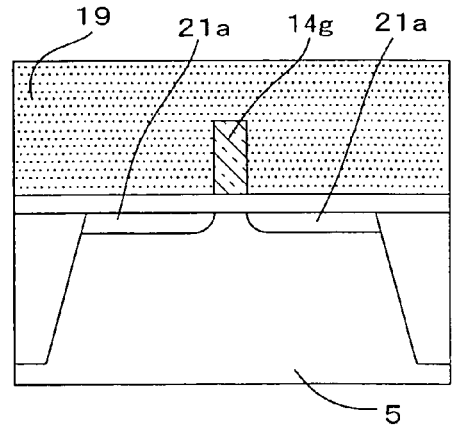
Figure 11B:
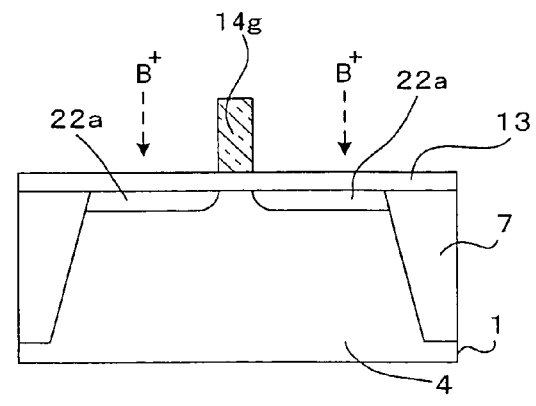

Then, as shown in FIGS. 10A and 10B, arsenic is ion-implanted into the P-well 5 exposed from a photoresist 18 in a state that a region over the N-well 4 is covered with the photoresist 18. Thus, an n-type extension region 21a is formed in the P-well 5 on both sides of the gate electrode 14g respectively. As the arsenic ion implantation conditions, for example, an acceleration energy of 1 keV and a dosage of $1\times10^{15}/cm^2$ are selected. Then, the photoresist 18 is removed. Then, as shown in FIGS. 11A and 11B, boron is ion-implanted into the N-well 4 exposed from a photoresist 19 in a state that a region over the P-well 5 is covered with another photoresist 19. Thus, a p-type extension region 22a is formed in the N-well 4 on both sides of the gate electrode 14g respectively. As the boron ion implantation conditions, for example, an acceleration energy of 0.5 keV and a dosage of $1\times10^{15}/cm^2$ are selected.

Figure 12A:
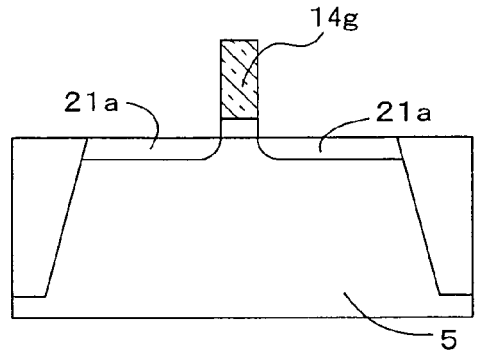
Figure 12B:
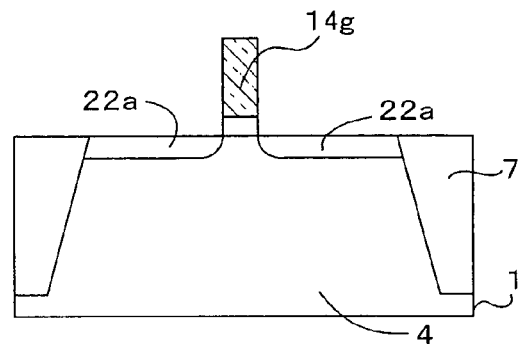
Figure 13A:
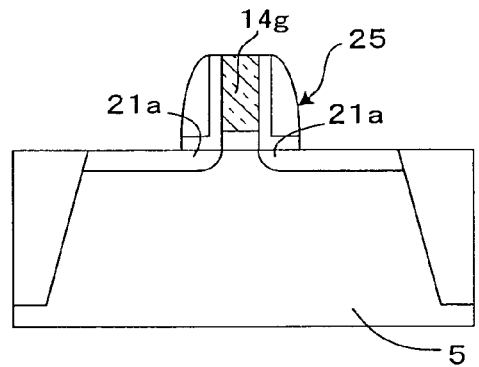
Figure 13B:
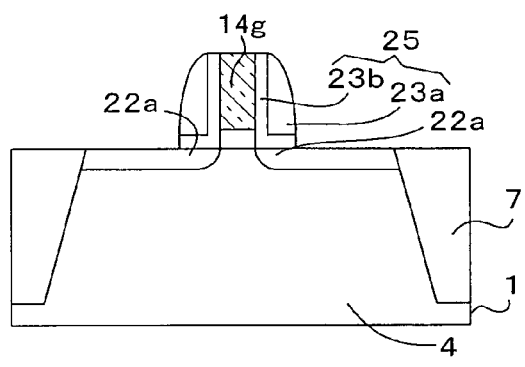

Then, the photoresist 19 is removed. Then, as shown in FIGS. 12A and 12B, the gate insulating film 13 in regions except the gate electrode 14g is removed by the hydrofluoric acid, for example. Then, as shown in FIGS. 13A and 13B, a silicon oxide film 23a of 10 nm thickness and a silicon nitride film 23b of 80 nm thickness are formed sequentially on the silicon substrate 1 by the CVD method. Then, a sidewall 25 is left on side portions of the gate electrode 14g respectively by etching back the silicon nitride film 23b and the silicon oxide film 23a.

Then, a silicon oxide film 24 of 30 nm thickness is grown on the silicon substrate 1 by the CVD method. The silicon oxide film 24 is left on side portions of the gate electrode 14g by etching back this silicon oxide film, so that a width of the sidewall 25 is widened.

Figure 14A:
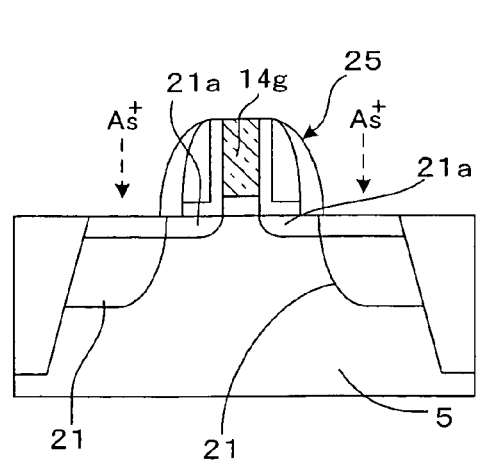
Figure 14B:
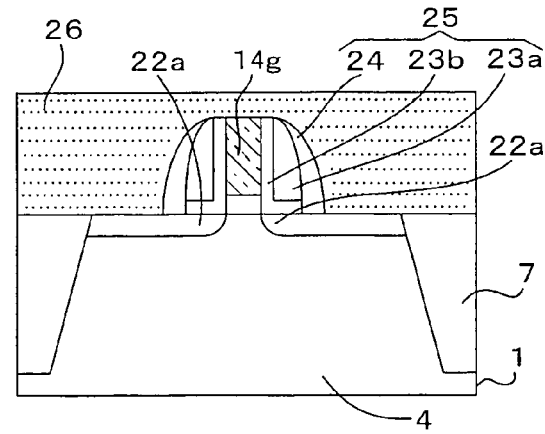

Then, as shown in FIGS. 14A and 14B, a photoresist 26 is coated on the silicon substrate 1. Then, this photoresist 26 is exposed/developed such that the N-well is covered and the extension regions 21a on the surface of the P-well 5 are exposed. Then, an n-type source/drain region 21 is formed on both sides of the gate electrode 14g by ion-implanting arsenic into the P-well 5. In this case, as the arsenic ion implantation conditions, for example, an acceleration energy of 35 keV and a dosage of $2\times10^{15}/cm^2$ are selected.

Then, the photoresist 26 is removed. The silicon oxide film 24 as the outermost layer of the sidewall 25 is removed by the hydrofluoric acid.

Figure 15A:
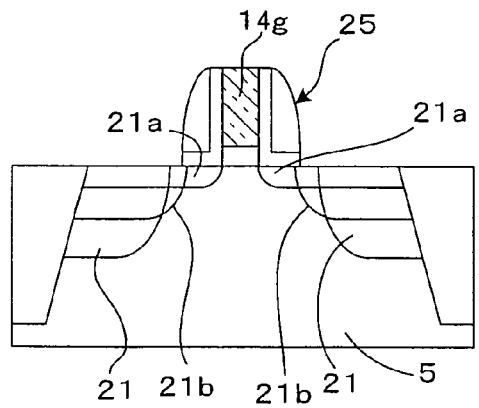
Figure 15B:
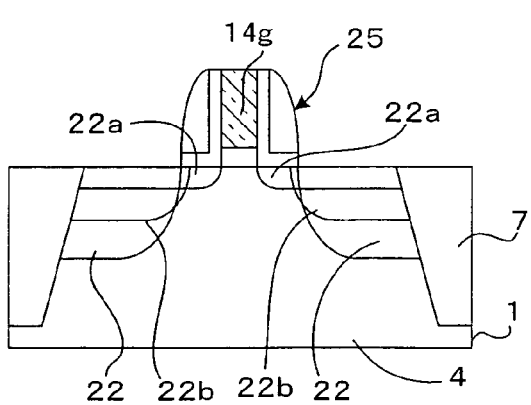

In turn, as shown in FIGS. 15A and 15B, boron is ion-implanted into the N-well 4 in a state that a region of the P-well 5 is covered with a photoresist. Thus, a p-type source/drain region 22 is formed on both sides of the gate electrode 14g respectively. In this case, as the boron ion implantation conditions, for example, an acceleration energy of 6 keV and a dosage of $6\times10^{15}/cm^2$ are selected.

Then, the P-well 5 and the N-well 4 are covered alternately with a photoresist. Then, boron is ion-implanted into the N-well 4 exposed from the photoresist, and thus a lower resistance region 21b is formed to lower the resistance of the extension region 21a. Also, arsenic is ion-implanted into the P-well 5 exposed from the photoresist, and thus a lower resistance region 22b is formed to lower the resistance of the extension region 22a.

In this case, in FIGS. 12A and 12B, the step of forming the lower resistance region 22b may be executed before or after the ion implantation into the extension region 22a. Also, the steps of forming and removing the silicon oxide film 24 as the outermost layer of the sidewall 25 is not essential to the present invention. The ion implantation to form the source/drain regions 21, 22 may be executed in state as shown in FIGS. 13A and 13B.

After this, the dopants implanted into the N-well 4 and the P-well 5 respectively are activated by annealing the silicon substrate 1.

Figure 16A:
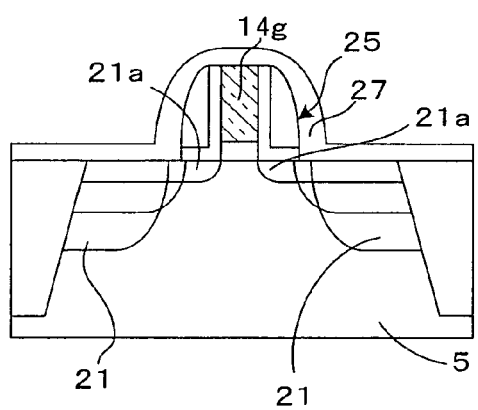
Figure 16B:
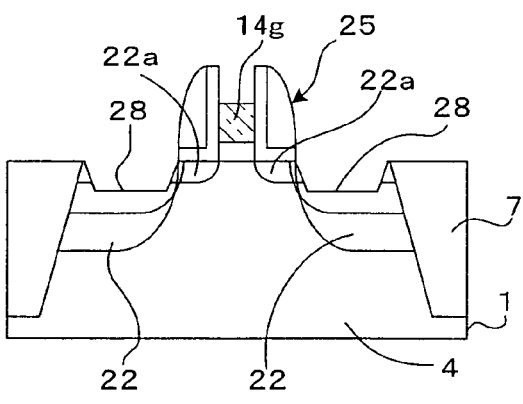

Then, a silicon oxide film 27 is formed on the silicon substrate 1 by the CVD method. Then, a photoresist is coated on the silicon substrate 1. This photoresist is exposed/developed such that the source/drain regions 21 on the P-well 5 are covered and the source/drain regions 22 on the N-well 4 are exposed. Then, as shown in FIGS. 16A and 16B, the silicon oxide film 27 on the N-well 4 is removed by executing the etching while using the photoresist as a mask. Thus, the N-well 4 and the gate electrode 14g, the sidewalls 25, and the source/drain regions 22 formed on the N-well 4 are exposed.

Then, the photoresist is removed. Then, recess portions 28 having a depth of about 30 nm, for example, are formed by selectively etching the N-well 4 on both sides of the gate electrode 14g by chlorine and a dilution gas. In this case, the silicon oxide film 27 and the gate electrode 14g formed of polysilicon and exposed from the sidewall 25 are also etched.

Figure 17A:
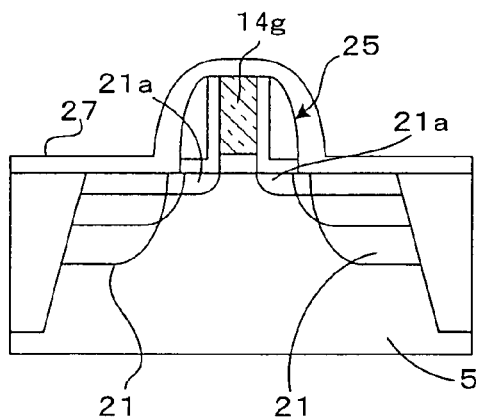
Figure 17B:
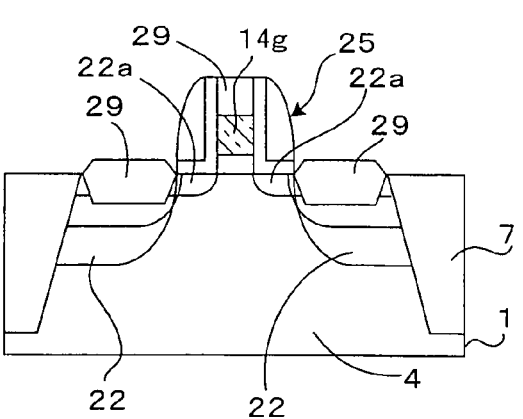

Then, as shown in FIGS. 17A and 17B, a silicon germanium (SiGe) layer 29 is selectively grown in the recess portions 28 of the N-well 4 and on the top portion of the gate electrode 14g. The SiGe layer 29 is grown by the CVD method using a reaction gas containing $SiH_4$ and $GeH_4$. Under the gate electrode 14g of the N-well 4 on the silicon substrate 1, a mobility of the hole is enhanced due to a compressive stress generated by the growth of the SiGe layer 29 on both sides of the gate electrode 14g. As a result, the performance of the PMOS transistor formed in the N-well 4 can be improved.

The formation of the SiGe layer 29 may be omitted. Also, such a structure may be employed that a mobility of the electron in the P-well 5 is enhanced by growing silicon carbide (SiC) on the surface of the P-well 5.

Figure 18A:
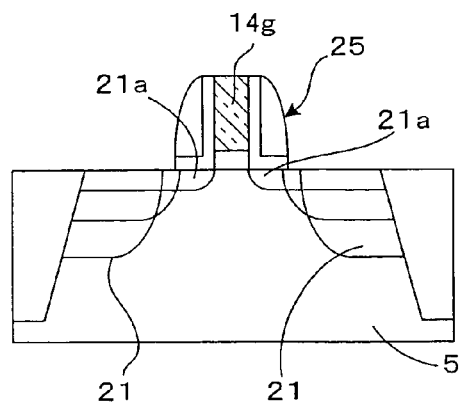
Figure 18B:
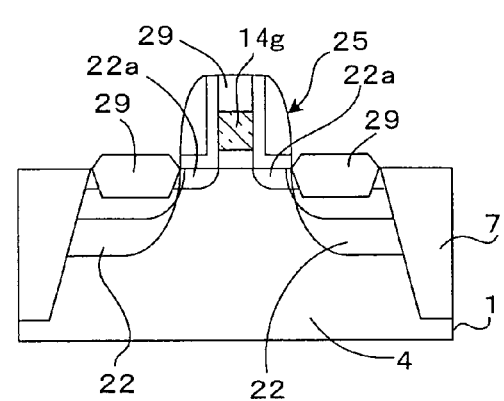
Figure 19A:
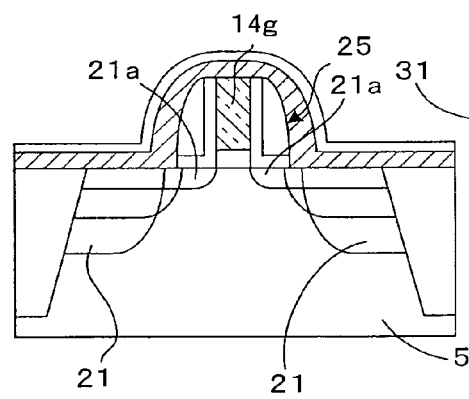
Figure 19B:
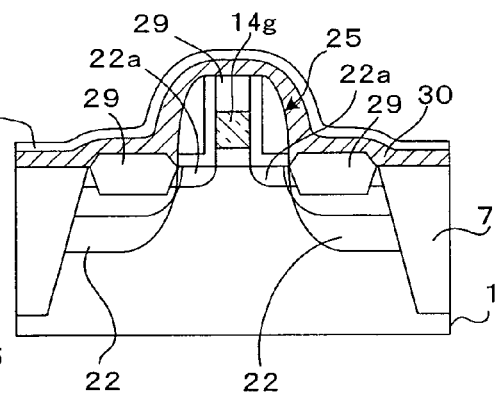

Then, as shown in FIGS. 18A and 18B, the silicon oxide film 27 is removed by the hydrofluoric acid. Then, as shown in FIGS. 19A and 19B, a nickel (Ni) film 30 of 20 nm thickness is formed by the sputtering using a nickel target, whereby the gate electrode 14g, the N-well 4, the P-well 5, and the SiGe layer 29 are covered with the Ni film 30.

In this case, in place of the Ni film 30, a NiPt film may be formed by using a nickel platinum target that contains platinum at 1 atomic percent to 10 atomic percent. A thickness of the Ni film 30 or the NiPt film may be set to more than 8 nm but less than 200 nm.

Also, a protection film 31 made of titanium nitride is formed on the Ni film 30 by the sputtering. The TiN is formed by suing a titanium (Ti) target and a nitrogen gas. In this case, Ti may be formed as the protection film 31 instead of the TiN. Also, the formation of the protection film 31 is not always needed.

In this case, prior to the formation of the Ni film 30, the surface of the silicon substrate 1 is cleaned by buffer hydrofluoric acid. The conditions of this cleaning are set to etch a thickness of 5 nm in terms of the thermal oxide film.

Figure 20A:
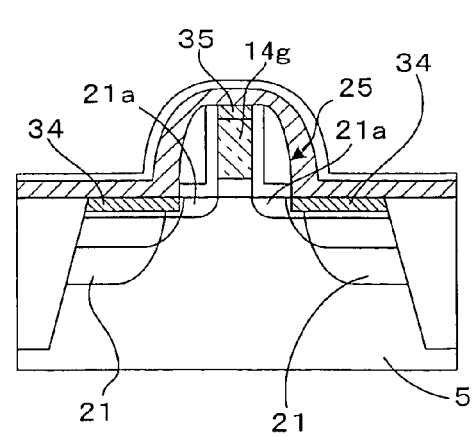
Figure 20B:
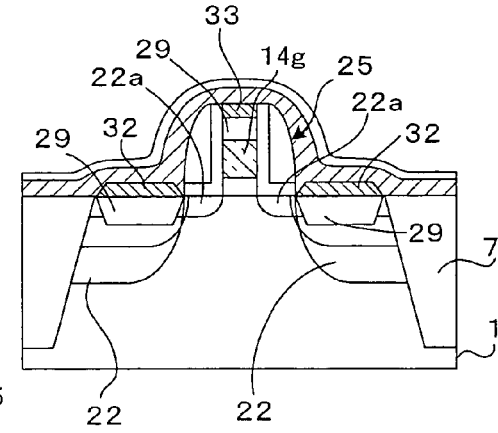

Then, as shown in FIGS. 20A and 20B, the silicon substrate 1 is annealed for 30 second at a temperature of 220° C. to 280° C. (e.g., 260° C.) to cause the reaction of nickel and silicon. Thus, silicide layers 32, 33 are formed on the SiGe layers 29 on the source/drain regions 22 and the gate electrode 14g in the N-well 4. The silicide layers 32, 33 are formed of a nickel silicide layer or a nickel platinum silicide layer respectively. The silicide layer 32 on the SiGe layers 29 contains a germanium. Also, silicide layers 34, 35 are formed on the source/drain regions 22 and the gate electrode 14g in the P-well 5.

Then, as shown in FIGS. 21A and 21B, the protection film 31 and the unreacted Ni film 30 are removed by using a solution of sulfuric acid and hydrogen peroxide water. In this solution, a mixture ration of sulfuric acid: hydrogen peroxide water=3:1, for example, is employed. Instead of the solution of sulfuric acid and hydrogen peroxide water, a solution of hydrochloric acid and hydrogen peroxide water or a solution of hydrochloric acid, nitric acid, and hydrogen peroxide water may be employed. Then, the silicide layers 32 to 35 are annealed in a temperature range of 300° C. to 500° C. to cause the reaction of nickel and silicon.

The silicon oxide ($SiO_x$ (x:composition ratio)) may be formed as the protection film on the silicide layers 32 to 35 by the plasma CVD method. In the step after the formation of the silicide layers 32 to 35, the processes are executed at 500° C. or less to prevent aggregation of the NiSi constituting the silicide layers 32 to 35.

Here, the silicide layers 34, 35 are not limited to the nickel silicide or the nickel alloy silicide. A cobalt silicide layer or a titanium silicide layer may be formed by using a Co film or a Ti film instead of the Ni film 30.

With the above, a PMOS transistor $T_1$ having the gate electrode 14g, the source/drain regions 21, and the like is formed in the N-well 4. Also, an NMOS transistor $T_2$ having the gate electrode 14g, the source/drain regions 22, and the like is formed in the P-well 5.

Then, as shown in FIGS. 22A and 22B, a silicon nitride film ($SiN_y$ film (y:composition ratio)) 37 and a silicon oxide film 38 are formed on the silicon substrate 1 by the plasma CVD method to have a thickness of 50 nm and a thickness of 600 nm respectively. In this case, a growth temperature for the silicon nitride film 37 and the silicon oxide film 38 is set to 400° C., for example. The silicon nitride film 37 and the silicon oxide film 38 act as an interlayer insulating film. For the purpose of controlling a stress of the channel portion, a nitride film having a tensile stress or a nitride film having a compressive stress may be used as the silicon nitride film 37.

Then, as shown in FIGS. 23A and 23B, the silicon oxide film 38 is polished by the CMP to planarize its upper surface.

Figure 24A:
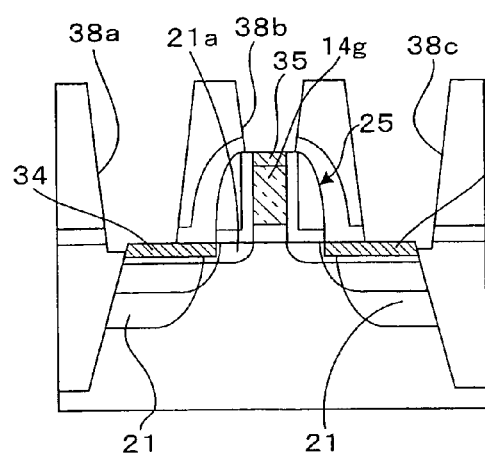
Figure 24B:
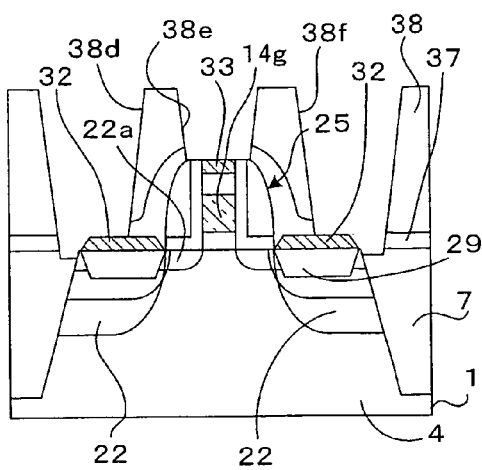

Then, a photoresist is coated on the silicon oxide film 38. Then, resist opening portions are formed on the silicide layers 33 to 35 on the gate electrodes 14g and the source/drain regions 21, 22 by exposing/developing this photoresist. Then, the silicon oxide film 38 and the silicon nitride film 37 are etched through the resist opening portions. Thus, as shown in FIGS. 24A and 24B, contact holes 38a to 38f are formed in the silicon oxide film 38 and the silicon nitride film 37. The contact holes 38a to 38f have a diameter of 45 to 80 nm at the bottoms of the source/drain regions 21, 22.

In this step, the silicon oxide film 38 is etched by the dry etching using a $C_{x1}F_{y1}/Ar/O_2$ based gas, and the silicon nitride film 37 is etched by the dry etching using a $CH_{x2}F_{y2}/O_2/Ar$ based gas. The contact holes 38a, 38c, 38d, 38f are formed in positions that overlap partially with the STI 7. Therefore, the STI 7 made of the silicon oxide film is also etched slightly in forming the contact holes 38a, 38c, 38d, 38f. As a result, a substantial aspect ratio of the contact holes 38a, 38c, 38d, 38f is increased respectively, and unevenness is formed at the bottoms of the contact holes 38a, 38c, 38d, 38f.

Then, the photoresist used to form the contact holes 38a to 38f is removed, and then insides of the contact holes 38a to 38f are cleaned by the argon ion negative sputtering. The conditions of the negative sputtering are set to etch a thickness of 5 nm in terms of the thermal oxide film, and then bottom portions and side walls of the contact holes 38a to 38f are cleaned. As the cleaning process, a chemical reaction using a fluorine compound gas such as $NF_3$, or the like may be employed. Because the negative sputtering removes physically the surface of the silicide on the bottom portions of the contact holes 38a to 38f, sometimes a chemical cleaning using a fluoride gas is advantageous in cleaning the thin silicide. Also, when the contact holes 38a to 38f have a high aspect ratio, the chemical cleaning is more effective than the negative sputtering in cleaning the bottom portions of the contact holes 38a to 38f sufficiently.

Figure 25A:
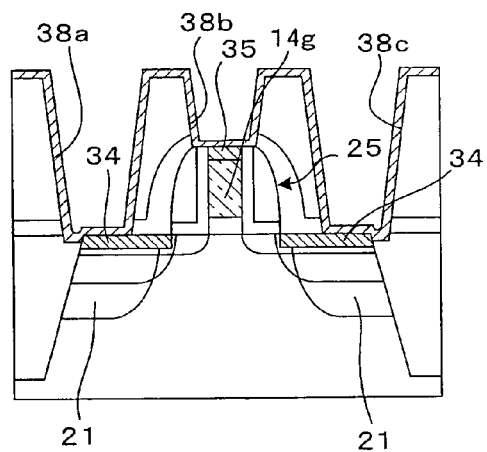
Figure 25B:
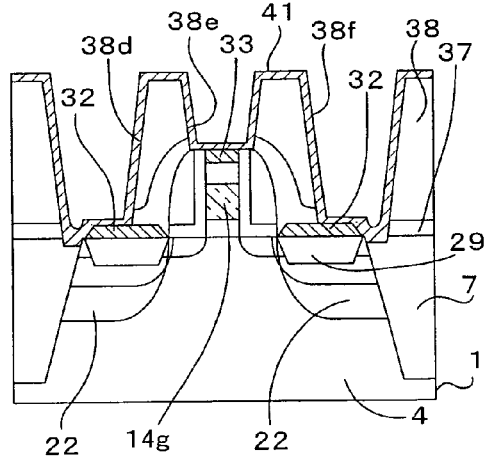

Then, as shown in FIGS. 25A and 25B, a Ti layer 41 is formed as a adhesive layer on the bottom portions and the side walls of the contact holes 38a to 38f and the silicon oxide film 38 by CVD method not to expose to an atmosphere. The Ti layer 41 is formed to have a thickness of 2 nm to 8 nm, e.g., 5 nm.

The Ti layer 41 is grown by using a reaction gas containing an inert gas such as Ar, $H_2$, He, or the like as a reaction/dilution gas on a titanium tetrachloride basis. In growing the Ti layer 41, a substrate temperature is set to 150° C. to 700° C., for example, preferably 300° C. to 650° C., and more 400°

C. to 600° C. From a viewpoint of thermal stability of the silicide, 600° C. or less is desirable. In this case, a titanium tetrabromide may be employed in place of $TiCl_4$.

A pressure of the growth atmosphere of the Ti layer 41 is set to 4.5 Pa. Among the reaction gas introduced into the growth atmosphere, a flow rate ratio of $TiCl_4$ and a dilute gas is set to 1: about 250 and a flow rate ratio of $TiBr_4$ and a dilute gas is set to 1: about 150.

Since chlorine and bromine constituting $TiCl_4$ and $TiBr_4$ respectively have a reducing power, the oxide film on the surfaces of the silicide layers 32 to 35 under the contact holes 38a to 38f is removed in forming the Ti layer 41.

Figure 26A:
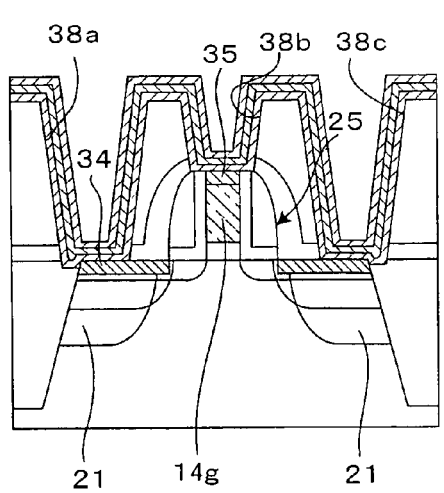
Figure 26B:
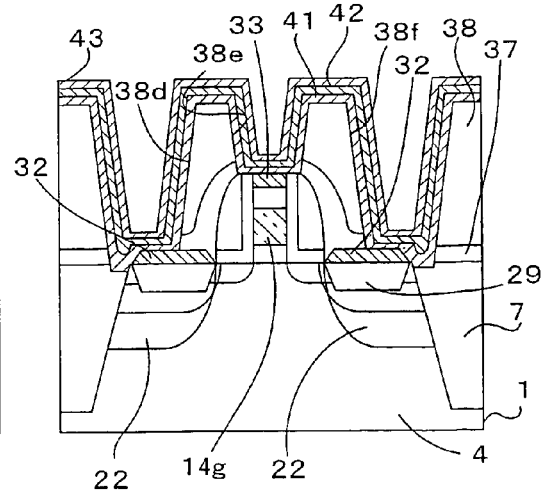

Then, the annealing is executed in a hydrogen ($H_2$) atmosphere to clean the surface of the Ti layer 41. Then, as shown in FIGS. 26A and 26B, a tantalum (Ta) layer is formed as a barrier metal layer 42 on the Ti layer 41 by the sputtering to have a thickness of 1 nm to 20 nm, e.g., 15 nm. Then, a Cu seed layer 43 is formed on the barrier metal layer 42 by the sputtering to have a thickness of 50 nm, for example.

In this case, it is preferable that the Ti layer 41 should not be exposed to an atmosphere in processes from the formation of the Ti layer 41 to the annealing in the $H_2$ atmosphere. But the Ti layer 41 may be exposed to the atmosphere depending on the conditions.

The barrier metal layer 42 is not limited to the Ta layer. Any one of Ta, TiN, TaN, Ru, WN, W—N—C, Ti—Si—$N_x$ ($0 \leq x < 1$), Ta—Si—$N_x$ ($0 \leq x < 1$), and W—Si—$N_x$ ($0 \leq x < 1$) or their combination may be employed.

Also, the seed layer 43 is not limited to Cu. Any one of Ru, CuMn, CuAl, CuMg, CuSn, and other copper alloy or their combination may be employed. When CuMn is used as the seed layer 43, the formation of the barrier metal layer 42 may be omitted because Mn can form the barrier layer in self-alignment manner.

A thickness of the barrier metal layer 42 is set to about 1 nm to 25 nm. Preferably such thickness should be decided to the lowest minimum value that can suppress a diffusion of Cu at 400° C. for a long time, e.g., several hours or more. Such thickness of the barrier metal layer 42 is different depending on the material, but it is desirable that the Ta layer, if employed, should be stacked up to 1 nm thickness or more on the sidewalls of the contact holes 38a to 38f. When the barrier metal layer 42 is formed too thick, an amount of Cu of the plug material formed in the contact holes 38a to 38f thereafter is reduced and thus the contact resistance is increased. Therefore, preferably the maximum film thickness of the barrier metal layer 42 should be set to 20 nm or less.

In this case, in order to improve the barrier property, the TiN layer having a thickness of about 1 nm to 5 nm may be formed between the barrier metal layer 42 and the Ti layer 41.

Figure 27A:
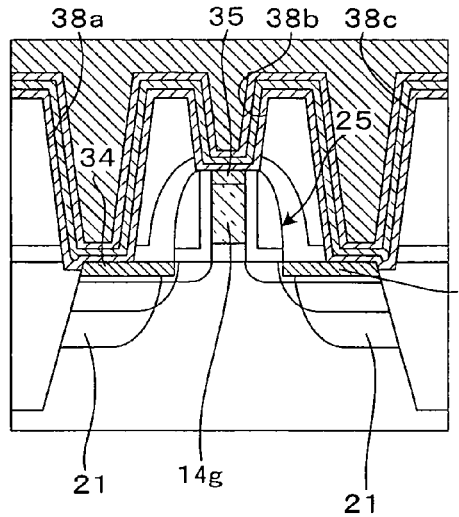
Figure 27B:
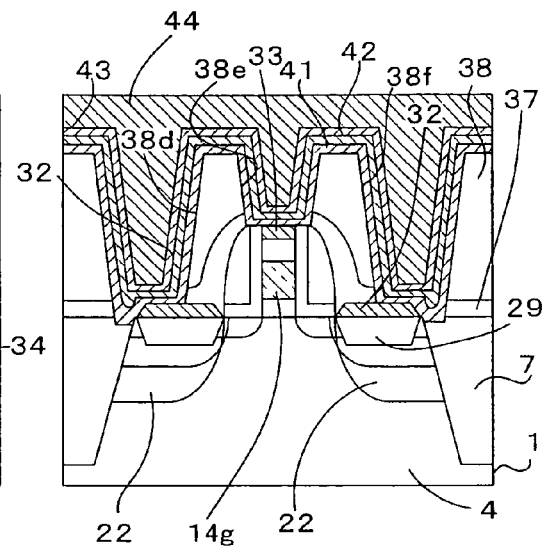

Then, as shown in FIGS. 27A and 27B, a Cu layer 44 is formed by the plating and filled in the contact holes 38a to 38f. A thickness of the Cu layer 44 is set to almost 400 nm on the upper surface of the silicon oxide film 38.

Figure 28A:
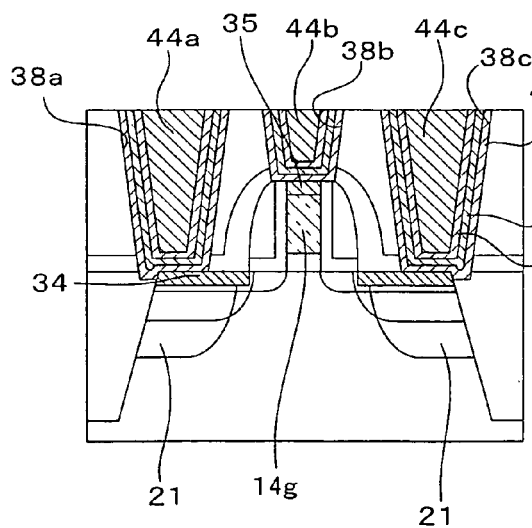
Figure 28B:
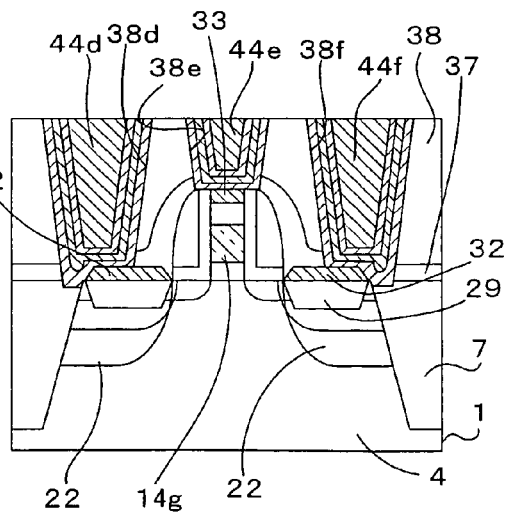

Then, as shown in FIGS. 28A and 28B, the Cu layer 44 is removed from the upper surface of the silicon oxide film 38 by the CMP while using the barrier metal layer 42 as an end-point sensing layer. Then, the barrier metal layer 42 and the Ti layer 41 are removed from the upper surface of the silicon oxide film 38 by the polishing. As a result, the Cu layer 44, the seed layer 43, the barrier metal layer 42, and the Ti layer 41 being left in the contact holes 38a to 38f constitute copper plugs 44a to 44f.

Figure 29:
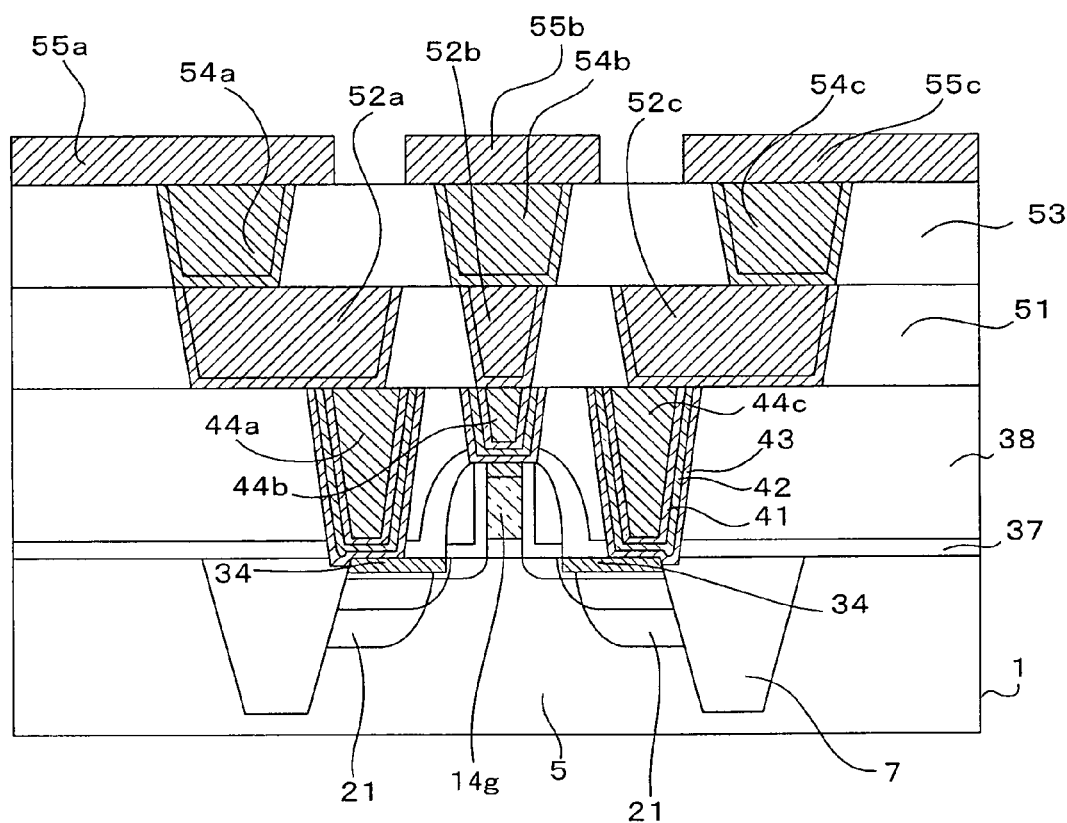
Figure 30:
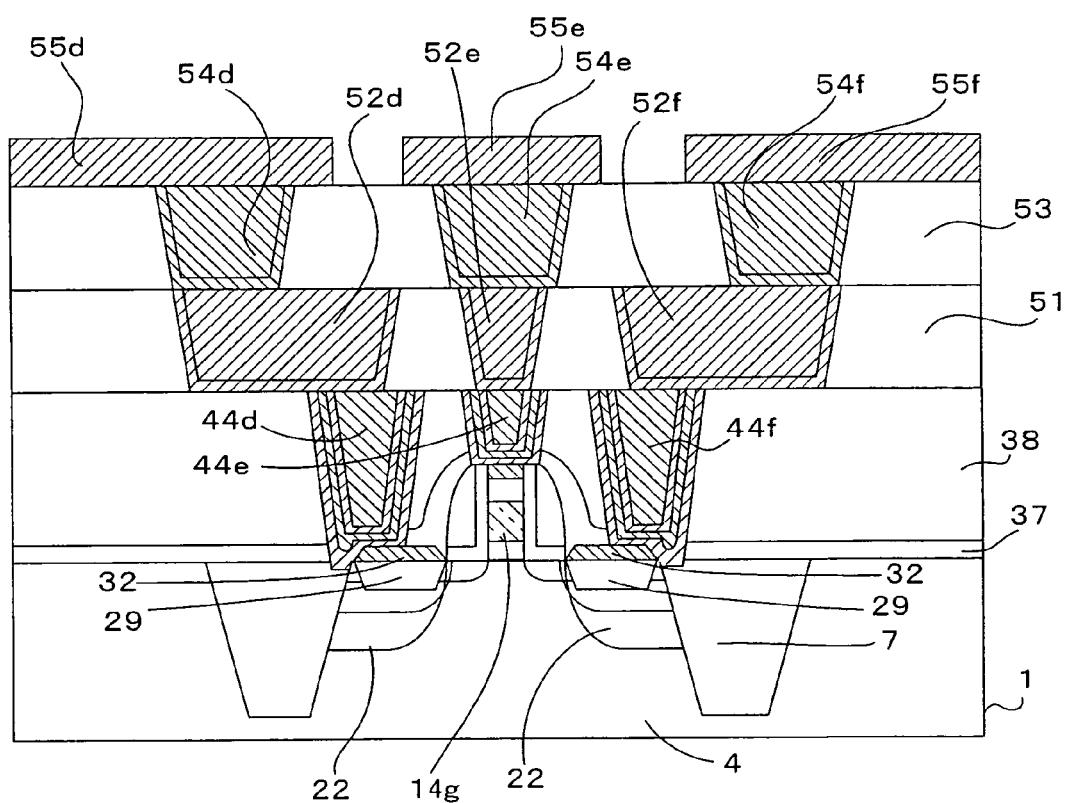

Then, as shown in FIG. 29 and FIG. 30, a second interlayer insulating film 51 is formed on the silicon oxide film 38. Then, wiring recesses connected to the first-layer copper plugs 44a to 44f respectively are formed by patterning the second interlayer insulating film 51, and then copper wirings 52a to 52f are formed in the wiring recesses. The process of forming the copper wirings 52a to 52f has steps of first forming the wiring recesses in the second interlayer insulating film 51, then forming the Ta barrier metal and the copper film sequentially, and then removing the Ta barrier metal and the copper film from the upper surface of the second interlayer insulating film 51 by the CMP, or the like.

Then, a third interlayer insulating film 53 is formed on the second interlayer insulating film 51 and the copper wirings 52a to 52f, then contact holes connected to the copper wirings 52a to 52f respectively are formed by patterning the third interlayer insulating film 53, and then second-layer copper plugs 54a to 54f are formed. The process of forming the copper plugs 54a to 54f has steps of first forming the contact holes in the third interlayer insulating film 53, then forming the Ta barrier metal and the copper film sequentially in the contact holes, and then removing the Ta barrier metal and the copper film from the upper surface of the third interlayer insulating film 53 by the CMP, or the like.

Then, the copper plugs 54a to 54f in the third interlayer insulating film 53 are connected to aluminum wirings 55a to 55f formed on the third interlayer insulating film 53. Here, the upper surfaces of the second and third interlayer insulating films 51, 53 are planarized by the CMP respectively.

In the method of manufacturing the semiconductor device as explained above, the Ti layer 41 is formed on the inner surfaces of the contact holes 38a to 38f as a glue layer by the CVD method with good coverage. As a result, the silicide layers 32 to 35 can be covered satisfactorily with the Ti layer 41 on the bottom portions of the contact holes 38a to 38f.

In addition, as shown in FIG. 24A to FIG. 26A, and FIG. 24B to FIG. 26B, since the Ti layer 41 are formed on the inner surfaces of the contact holes 38d, 38f by the CVD method, the level difference or unevenness between the silicide layer 32 and the STI 7 generated on the bottom portions, for example, are buried by the Ti layer 41. Therefore, the bottom areas of the contact holes 38d, 38f can be planarized.

Accordingly, a substantial aspect ratio of the contact holes 38d, 38f in forming the barrier metal layer 42 on the Ti layer 41 can be reduced, and also the barrier metal layer 42 can be grown on the inner surfaces of the contact holes 38d, 38f with good coverage.

Also, since the overall bottoms in the contact holes 38d, 38f are covered with the barrier metal layer 42, a contact between the copper layer 44 and the silicide layers 32 to 35 can be prevented. In addition, since the barrier metal layer 42 is formed with good coverage, generation of the void in the contact holes 38a to 38f is prevented.

Accordingly, a contact between the copper layer 44 buried in the contact holes 38a to 38f and the silicide layers 32 to 35 can be prevented satisfactorily by the barrier metal layer 42.

Also, the oxide film on the surfaces of the silicide layers 32 to 35 under the contact holes 38a to 38f is removed by the cleaning process applied before the Ti layer 41 is formed or the reducing action in forming the Ti layer 41. Therefore, an increase of the contact resistance between the Ti layer 41 and the silicide layers 32 to 35 can be prevented.

With the above, a junction leakage between the copper plugs 44a, 44c, 44d, 44f formed in the contact holes 38a, 38c, 38d, 38f and the silicide layers 32, 34 can be prevented on the source/drain regions 21, 22. In addition, even when diameters of the contact holes 38a to 38f are narrowed to 80 nm or less, generation of the void in the contact holes 38a, 38c, 38d, 38f can be prevented and the contact resistance of the copper plugs can be lowered by removing the oxide film on the surfaces of the silicide layers 32, 34. As the semiconductor device to which respective diameters of the contact holes 38a to 38f are reduced to 80 nm or less, there is SRAM, for example.

Figure 31:
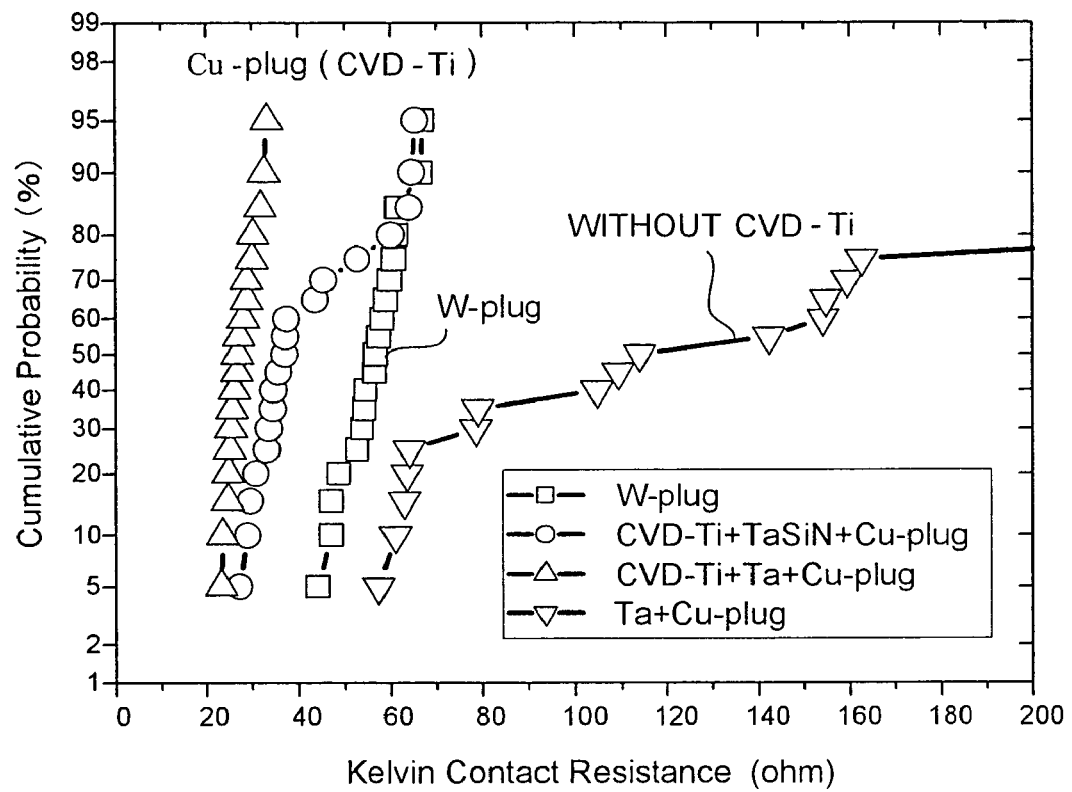
FIG. 31 is a distribution chart of a cumulative probability of respective contact resistances of a plug according to the embodiment of the present invention and a plug in the prior art.

FIG. 31 shows measured results of respective contact resistances of the copper plug in both cases where the Ti layer is formed on the inner surfaces of the contact holes by the CVD method and where no Ti layer is formed and the tungsten (W) plug in the prior art.

According to FIG. 31, it is appreciated, when the Ti layer is formed as the glue layer of the copper plug by the CVD method, that the contact resistance can be reduced to about ⅓. Also, when both cases where the Ta layer is formed as the barrier layer of the copper plug and where the TaSiN layer is formed as the barrier layer are compared with each other, the Ta layer can give the smaller contact resistance.

In the foregoing specification, the invention has been described with reference to specific embodiments thereof. It will, however, be evident that various modifications and changes may be made thereto without departing from the broader spirit and scope of the invention. For example, the reader is to understand that the specific ordering and combination of process actions described herein is merely illustrative, and the invention can be performed using different or additional process actions, or a different combination or ordering of process actions. As a further example, each feature of one embodiment can be mixed and matched with other features shown in other embodiments. Additionally and obviously, features may be added or subtracted as desired. Accordingly, the invention is not to be restricted except in light of the attached claims and their equivalents.

Other systems, methods, features and advantages of the invention will be or will become apparent to one with skill in the art upon examination of the figures and detailed description. It is intended that all such additional systems, methods, features and advantages be included within this description, be within the scope of the invention, and be protected by the accompanying claims.

What is claimed is:

1. A method of manufacturing a semiconductor device, comprising: forming a silicide layer over a semiconductor substrate; forming an insulating film over the silicide layer; forming a hole reaching the silicide layer in the insulating film; forming a titanium layer over a bottom surface and an inner wall surface of the hole, wherein the titanium layer is formed by a chemical vapor deposition, wherein the titanium layer has a thickness of 2 nm to 8 nm over a side wall of the hole; cleaning the surface of the formed titanium layer by annealing the semiconductor substrate in a hydrogen atmosphere after forming the titanium layer without exposing the titanium layer to an atmosphere during a first process for the forming the titanium layer to a second process for the annealing in the hydrogen atmosphere; forming a barrier layer having a thickness of 1 nm to 20 nm by sputtering for preventing copper diffusion over the titanium layer in the hole, wherein the barrier layer is directly formed on the titanium layer after the cleaning; and burying a copper layer in the hole.

2. The method of claim 1, wherein the titanium layer is formed by a CVD method.

3. The method of claim 2, wherein a source gas contains at least one of $TiCl_4$ and $TiBr_4$ in the CVD method.

4. The method of claim 3, wherein the CVD method is executed to contain further an inert gas.

5. The method of claim 2, wherein the titanium layer is grown while heating the semiconductor substrate at a temperature in a range of 400° C. to 600° C.

6. The method of claim 1, further comprising:
cleaning an inside of the hole and a surface of the silicide layer before forming the titanium layer.

7. The method of claim 6, wherein cleaning the inside of the hole and the surface of the silicide layer is executed by either of a sputter cleaning with an argon ion and a cleaning with a fluorine compound gas.

8. The method of claim 1, wherein the barrier layer is a film that is at least one selected from of Ta, TiN, TaN, Ru, WN, W—N—C, Ti—Si—N, Ta—Si—N, and W—Si—N.

9. The method of claim 1, wherein burying the copper layer in the hole includes forming a seed layer over the barrier layer in the hole.

10. The method of claim 9, wherein the seed layer is formed of any one of Cu, Ru, and Cu alloy.

11. The method of claim 1, wherein the copper layer, the barrier layer, and the titanium layer over the insulating film are removed by a chemical mechanical polishing.

12. The method of claim 1, wherein the silicide layer includes any one of nickel silicide, cobalt silicide, and nickel alloy.

13. The method of claim 12, wherein the nickel alloy is an alloy of nickel and platinum.

14. The method of claim 1, wherein the silicide layer is formed over surfaces of source/drain regions, the source/drain region contacts an element isolation structure constructed by burying an insulating material in the semiconductor substrate, and a bottom portion of the hole is formed over the silicide layer and the element isolation structure that is adjacent to the silicide layer.

15. The method of claim 1, further comprising:
forming a silicon germanium layer over the surfaces of the source/drain regions of a PMOS transistor formed in the semiconductor substrate; and
forming the silicide layer by a reaction of the silicon germanium layer and a metal.

* * * * *